(12) United States Patent
Fries et al.

(10) Patent No.: US 11,482,985 B2
(45) Date of Patent: Oct. 25, 2022

(54) BAW RESONATOR, RF FILTER, MULTIPLEXER AND METHOD OF MANUFACTURING A BAW RESONATOR

(71) Applicant: RF360 EUROPE GMBH, Munich (DE)

(72) Inventors: Franz Sebastian Fries, Munich (DE); Christian Huck, Munich (DE); Maximilian Schiek, Puchheim (DE); Willi Aigner, Moosinning (DE)

(73) Assignee: RF360 Europe Gmbh, Munich (DE)

( * ) Notice: Subject to any disclaimer, the term of this patent is extended or adjusted under 35 U.S.C. 154(b) by 0 days.

(21) Appl. No.: 17/042,689

(22) PCT Filed: Feb. 27, 2019

(86) PCT No.: PCT/EP2019/054864
§ 371 (c)(1),
(2) Date: Sep. 28, 2020

(87) PCT Pub. No.: WO2019/185271
PCT Pub. Date: Oct. 3, 2019

(65) Prior Publication Data
US 2021/0126614 A1    Apr. 29, 2021

(30) Foreign Application Priority Data

Mar. 29, 2018   (DE) .................... 10 2018 107 602.9

(51) Int. Cl.
*H03H 9/205*   (2006.01)
*H03H 9/02*    (2006.01)
*H03H 9/13*    (2006.01)
*H03H 9/54*    (2006.01)
*H03H 3/02*    (2006.01)

(52) U.S. Cl.
CPC .............. *H03H 9/205* (2013.01); *H03H 3/02* (2013.01); *H03H 9/02015* (2013.01); *H03H 9/131* (2013.01); *H03H 9/54* (2013.01)

(58) Field of Classification Search
CPC ...... H03H 9/02; H03H 9/02015; H03H 9/131; H03H 9/54; H03H 3/02
See application file for complete search history.

(56) References Cited

U.S. PATENT DOCUMENTS

| 2010/0033063 A1 | 2/2010 | Nishihara et al. |
| 2011/0006638 A1 | 1/2011 | Ostrovskii et al. |
| 2014/0246305 A1 | 9/2014 | Larson, III et al. |

FOREIGN PATENT DOCUMENTS

CN    207896944 A    9/2018

OTHER PUBLICATIONS

International Search Report and Written Opinion dated Jun. 17, 2019 corresponding to Application No. PCT/EP2019/054864.

*Primary Examiner* — Samuel S Outten
(74) *Attorney, Agent, or Firm* — Patterson+ Sheridan, L.L.P.

(57) ABSTRACT

A BAW resonator with an improved lateral energy confinement is provided. The resonator has a bottom electrode in a bottom electrode layer, a top electrode in a top electrode layer and a piezoelectric layer between the bottom electrode layer and the top electrode layer. The piezoelectric layer comprises piezoelectric materials of different piezoelectric polarities.

26 Claims, 5 Drawing Sheets

BAW RESONATOR, RF FILTER, MULTIPLEXER AND METHOD OF MANUFACTURING A BAW RESONATOR

CROSS-REFERENCE TO RELATED APPLICATIONS

This application is a national stage application under 35 U.S.C. 371 of PCT/EP2019/054864, filed Feb. 27, 2019, which claims the benefit of German Application No. 10 2018 107 602.9, filed Mar. 29, 2018, both of which are incorporated herein by reference in their entireties.

The present invention refers to BAW resonators with improved electroacoustic properties, e.g. for use in RF filters for mobile communication devices.

RF filters in mobile communication devices are needed to separate wanted RF signals from unwanted RF signals. RF filters can be realized as bandpass filters or as band rejection filters. To allow RF filters with good performance, e.g. a low insertion loss in a passband and a high rejection level outside a passband, the corresponding resonators should have high quality factors and a good suppression of spurious modes. Further, the resonators should be manufacturable in a cost-efficient manner and should be mechanically and electrically robust to provide a high power capability.

Electroacoustic resonators can be established as BAW resonators. In BAW resonators a piezoelectric material is sandwiched between a bottom electrode and a top electrode. To prevent acoustic energy from dissipating in a carrier substrate an acoustic mirror can be arranged between the bottom electrode and the carrier substrate (SMR-type resonator, SMR=solidly mounted resonator) or a cavity can be arranged below the bottom electrode of the resonator (FBAR-type resonator, FBAR=film bulk acoustic resonator). To suppress lateral modes it is possible to arrange a frame structure on the top electrode of the layer stack.

However, in known BAW resonators the means to reduce spurious modes increase manufacturing costs and the complexity of manufacturing steps.

Thus, what is wanted is a BAW resonator that can be manufactured with reduced manufacturing costs using less complex manufacturing steps and that provides a reduction of spurious modes, an increased quality factor and an increased mechanical and electrical robustness.

To that end, a BAW resonator, an RF filter, a multiplexer and a method of manufacturing a BAW resonator are provided according to the independent claims. Dependent claims provide preferred embodiments.

The BAW resonator comprises a bottom electrode layer with a bottom electrode and a top electrode layer with a top electrode. The top electrode layer is arranged above the bottom electrode layer. Further, the BAW resonator comprises a piezoelectric layer with a first piezoelectric material and a second piezoelectric material. The first piezoelectric material and the second piezoelectric material have different piezoelectric polarities. A first segment of the first piezoelectric material is arranged between a first segment of the second piezoelectric material and a second segment of the second piezoelectric material.

Such a layer construction has the bottom electrode structured in the bottom electrode layer and the top electrode structured in the top electrode layer. Two piezoelectric materials are used as the piezoelectric material in the piezoelectric layer between the bottom electrode layer and the top electrode layer.

The arrangement of the first segment of the first piezoelectric material between the first and the second segment of the second piezoelectric material establishes a lateral energy confinement such that acoustic energy leakage in a lateral direction is reduced or prevented.

A reduced lateral energy leakage increases the quality factor of the corresponding resonator. As a consequence thereof corresponding RF filters have improved electric properties and provide an improved performance. In particular, the insertion loss within a passband is reduced.

It is possible that the active area of the BAW resonator is mainly filled with the piezoelectric material. The second piezoelectric material can be arranged in the rim region surrounding the first piezoelectric material in the active area of the resonator. Thus, the first piezoelectric material is mainly employed to convert between RF signals and acoustic waves. The second piezoelectric material establishes, in combination with the first piezoelectric material, the lateral energy confinement or an acoustic wave barrier.

To that end, it is possible that at least a part of the first segment of the second piezoelectric material or a part of the second segment of the second piezoelectric material is arranged in the vicinity of the top electrode and in the vicinity of the bottom electrode.

The different polarities of the first piezoelectric material and of the second piezoelectric material cause the piezoelectric material—when an RF signal is applied to the BAW resonator—to oscillate with a phase difference to one another. Correspondingly, a phase shift in the displacement of the first piezoelectric material with respect to the second piezoelectric material is obtained and interference takes place such that acoustic energy leakage from the active area of the resonator to its surrounding is prevented or reduced.

In this context the term "active area" of the BAW resonator mainly denotes the volume of the resonator in which the wanted main mode of the resonator propagates. The main mode of the BAW resonator is a longitudinal wave propagating in the vertical direction.

Thus, it is possible that the second piezoelectric material is a lateral energy barrier.

Further, it is possible that the second piezoelectric material is provided to generate an interference signal. The interference signal can be an acoustic interference signal that interferes with acoustic wave modes having a wave vector in a lateral direction. The lateral directions are characterized in that they are perpendicular to the vertical direction in which the wave modes of the wanted acoustic waves propagate.

In particular, it is possible that the first piezoelectric material and the second piezoelectric material have opposite polarities.

The first piezoelectric material and the second piezoelectric material can have the same stoichiometric composition. Different or opposite polarities may be obtained by flipping the lattice structure of the first piezoelectric material with respect to the second piezoelectric material.

It is possible that the second piezoelectric material terminates the active area of the resonator.

The footprint of the active area of the resonator can mainly be determined by the footprint of the bottom electrode or of the top electrode or of the area in which the top electrode and the bottom electrode overlap. It is possible that either the bottom electrode or the top electrode extend at least in some sections beyond the active area of the resonator. Thus, the termination of the active area by the second piezoelectric material can be obtained by surrounding the first piezoelectric material with the second piezoelectric material. The surrounding can be a complete surrounding or a partial surrounding. A complete surrounding is preferred to prevent "leakage windows" via which acoustic energy can leave the resonator structure. Thus, the termination is a lateral termination.

Material of the second piezoelectric material establishes a lateral termination to prevent lateral leakage. Vertical leakage can be prevented by having no further material on or above the top electrode at one side and by providing a cavity (FBAR-type resonator) or an acoustic mirror (SMR-type resonator) below the bottom electrode.

It is possible that the first piezoelectric material comprises segments of a single frame or segments of two or more frames of which one is nested in another.

Frame structures with material of the second piezoelectric material can be used to provide a fully enclosed surrounding at the rim area of the active area of the resonator. The frames can be cascaded, i.e. one frame can be in another frame.

The frame or the several frames can have a polygonal footprint with three, four, five, seven, . . . sides and corners. Nested frames comprising material of the second piezoelectric material can be separated from one another via air and/or via material of the first piezoelectric material. By having frames of the first and of the second piezoelectric material alternating one another, a one-dimensional Bragg-mirror structure can be obtained. This lateral Bragg-mirror structure can be characterized by a pitch and a width ratio. The pitch can be defined as the distance between nearest edges of the same piezoelectric material facing a same direction. Correspondingly, the ratio can be characterized by the width of one frame divided by the sum of the width of adjacent frames.

The pitch and the frame ratio can be selected to match the wave vector of spurious lateral modes that should be suppressed.

The number of alternating frames has an impact on the spectral width of the corresponding spurious lateral modes. Thus, the number of alternating frames can be selected according to the spectral width in which lateral modes should be suppressed.

It is possible that the resonator comprises segments of the first or of the second piezoelectric material wherein the height (in the vertical direction) of the piezoelectric material is different from the thickness of the piezoelectric layer, e.g. from the thickness of the piezoelectric layer in the active region of the resonator.

The thickness of the piezoelectric layer is mainly determined by the distance between the bottom electrode and the top electrode that mainly determines the resonance frequency of the resonator.

In the segments the height of the piezoelectric material can be chosen to be 50% of the thickness of the piezoelectric layer, for example, or to be smaller or larger. In particular, it is possible to have a zero height which means that in the corresponding segment no piezoelectric material is present in the piezoelectric layer.

It is possible that the BAW resonator has a growth layer between the bottom electrode layer and the piezoelectric layer.

The growth layer can be provided to improve the growth of the piezoelectric material in the piezoelectric layer. In particular, the growth layer can be used to determine the polarity of the corresponding first piezoelectric material and second piezoelectric material.

It is possible that the interface between the growth layer and the piezoelectric layer has a first section below the first piezoelectric material and a second section below the second piezoelectric material.

Thus, material of the growth layer in the first section can be used to determine the polarity of the piezoelectric material in the first segment and the material of the growth layer in the second section can be used to determine the polarity of the corresponding second piezoelectric material in the second segment.

To obtain different polarities in the different segments the interface structure of the growth layer can be different in the different sections. To that end, it is possible that the growth layer comprises a first material in the first section and a second material in the second section.

From the contributions "Effect of substrate composition on the piezoelectric response of a reactively sputtered AlN thin films" (J. A. Ruffner et al., Thin solid films 354 (1999), pages 256 to 261) and from the contribution "Sputtering of (001) AlN thin films: Control of polarity by a seed layer" (E. Milyutin et al., Journal of Vacuum Science & Technology B28, L61 (2010)) different materials allowing a piezoelectric material having different polarities are known.

It is possible that the growth layer in the first section comprises a material selected from an Oxide, a Nitride, Ru (ruthenium), $RuO_x$ (ruthenium oxide), MOPVE-AlN (MOPVE=Metal organic phase vapor epitaxy), $SiO_2$.

MOPVE-AlN is an aluminium nitride that was deposited using a metal organic phase vapor epitaxy technique.

Correspondingly, it is possible that the growth layer in the second section comprises material selected from an Oxide, a Nitride, Ru, $RuO_x$, MOPVE, $SiO_2$.

It is possible that the first piezoelectric material and/or the second piezoelectric material comprise or consist of AlN.

It is possible that the first piezoelectric material and/or the second piezoelectric material comprise or consist of a material selected from Sc (Scandium) doped AlN and $Al_{1-x}Sc_xN$ with $0 \leq x \leq 30$.

Further, instead of these materials, materials such as other metals and other metal oxides or nitrides are also possible.

In general, materials are possible that provide a surface with a selective preference to the adherence of Al vs. N as a first layer of the first and the second piezoelectric material in the case of an AlN based piezoelectric layer.

It is possible that the BAW resonator comprises a cut-out or a trench in the piezoelectric layer. Cut-outs or trenches, in particular such trenches that surround the active area in a frame-like structure, establish effective acoustic energy barriers because they provide a large difference in acoustic impedance at the interface between the piezoelectric material and vacuum or gas in the trench.

Further, during manufacturing steps, the presence of piezoelectric material with different polarities can be utilized to easily manufacture corresponding cut-outs or trenches. Thus, it is possible that the BAW resonator comprises a trench in the piezoelectric layer that (partially or fully) encloses the resonator's active area.

It is possible that an RF filter comprises a BAW resonator as described above.

It is possible that a multiplexer, e.g. a duplexer, a triplexer, a quadplexer, a quintplexer or a multiplexer of a higher degree, comprises such an RF filter.

BAW resonators as described above can be electrically connected in a ladder-type configuration with series resonators electrically connected in series in a signal path and with parallel resonators electrically connected in parallel paths electrically connecting the signal path to ground. A multiplexer, e.g. a duplexer, can comprise such a filter as a transmission filter and/or as a reception filter.

A method of manufacturing a BAW resonator can comprise the steps:
provide a bottom electrode layer,
structuring a bottom electrode in the bottom electrode layer,
depositing a first piezoelectric material and a second piezoelectric material in a piezoelectric layer on or above the bottom electrode layer, the first piezoelectric material and the second piezoelectric material having different polarities,
depositing a top electrode layer on or above the piezoelectric layer.

It is possible that a growth layer with a first section and a second section is deposited during the manufacturing method. In particular, it is possible that the growth layer is deposited on the bottom electrode layer and that the piezoelectric layer with the first and the second piezoelectric material is deposited on the growth layer.

Further, it is possible that the method comprises the step of selectively removing material selected from the first piezoelectric material and the second piezoelectric material.

Such a removal step can be utilized to establish a trench or a cut-out in the piezoelectric layer.

It is possible that the selective removal comprises the full removal of the first or second material.

The first piezoelectric material and the second piezoelectric material can have different etching rates for selected etching agents. For example aluminium nitride of different polarities has a different etching rate for potassium hydroxide (KOH). Thus, using such an etching agent the one piezoelectric material selected from the first and from the second piezoelectric material can be etched and at least partially or fully removed selectively.

Of course, frame structures on the top electrode are possible in addition to the segment or segments on the second piezoelectric material. However, the structure of the piezoelectric layer as described above may be sufficient to increase the quality factor, to reduce losses and to suppress unwanted lateral modes. Thus, by omitting the frame structure, the mechanical robustness and electrical robustness are increased.

Basic concepts and details of preferred embodiments are shown in the schematic accompanying figures.

In the figures.

Figure 1:
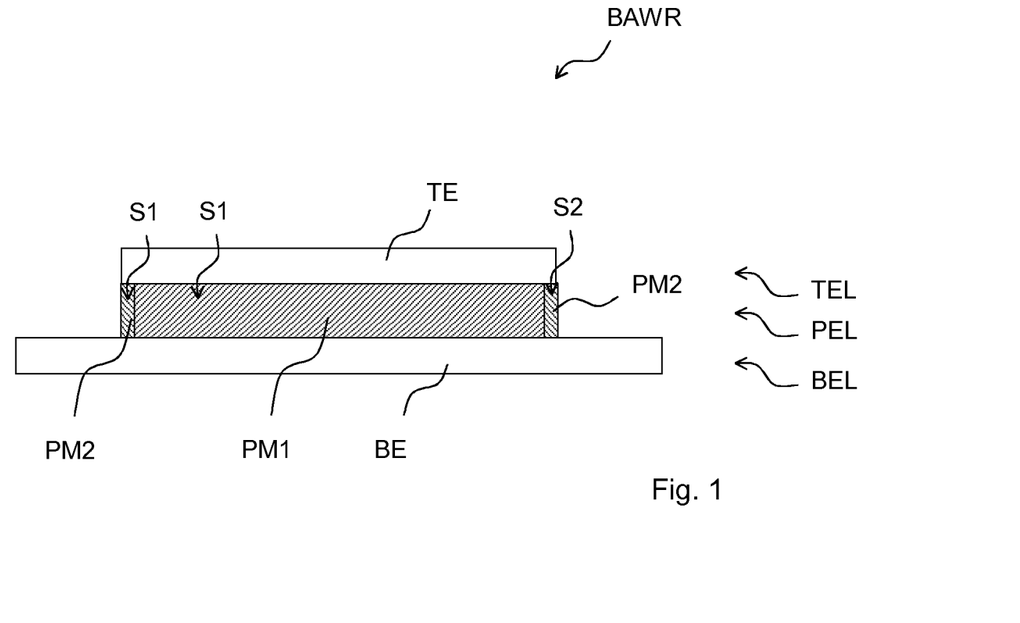
FIG. 1 shows a BAW resonator having a basic construction.

FIG. 1 shows a cross-section through a basic layer construction establishing a BAW resonator BAWR. The resonator has a bottom electrode layer BEL, a top electrode layer TEL arranged above the bottom electrode layer BEL. Further, the resonator has a piezoelectric layer PEL arranged between the bottom electrode layer and the top electrode layer. The bottom electrode layer exceeds the overlap area of the bottom electrode BE in the bottom electrode layer and the top electrode TE in the top electrode layer TEL. The top electrode TE mainly defines the resonator's active area. The piezoelectric layer PEL comprises a first segment S1 of the first piezoelectric material PM1. Further, the piezoelectric layer PEL comprises a first segment S1 and a second segment S2 of the second piezoelectric material PM2 in the piezoelectric layer PEL. The first section S1 of the first piezoelectric material PM1 is arranged between the first section S1 and the second section S2 of the second piezoelectric material PM2. The first piezoelectric material PM1 and the second piezoelectric material PM2 have different polarities. Thus, when an RF signal is applied to the bottom electrode BE and to the top electrode TE, then the first piezoelectric material PM1 and the second piezoelectric material PM2 have a phase shift in their oscillation. The phase shift causes a negative interference such that acoustic waves are prevented from leaving the active area of the resonator. Consequently, energy losses are reduced and the quality factor of the resonator BAWR is increased.

The distance between the bottom electrode BE in the bottom electrode layer BEL and the top electrode TE in the top electrode layer TEL mainly determines the resonance frequency and the thickness of the piezoelectric layer.

It is preferred that the second piezoelectric material PM2 is arranged in the vicinity of the rim region of the active area where the energy barrier has the largest impact on confining energy.

Figure 2:
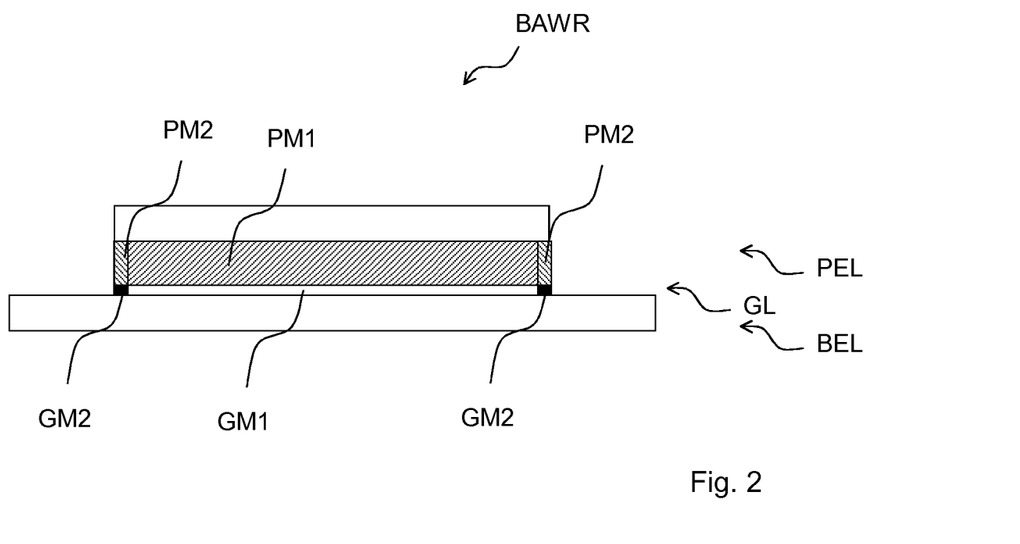
FIG. 2 shows the use of a growth layer.

FIG. 2 illustrates the use of a growth layer GL arranged between the bottom electrode layer BEL and the piezoelectric layer PEL. The growth layer can comprise different materials. In particular below the first piezoelectric material PM1 a first growth material GM1 can be arranged and below the second piezoelectric material PM2 a second growth material GM2 can be arranged. Thus, regarding the corresponding footprints, the footprint of the first section of the growth layer corresponds to the footprint of the first segment and of the first piezoelectric material and the footprint of the second section of the growth layer corresponds to the footprint of the second segment and of the second piezoelectric material.

The first material of the growth layer and the second material of the growth layer can be chosen such that the corresponding polarities of the first piezoelectric material PM1 and of the second piezoelectric material PM2 are obtained.

The thickness of the growth layer can be between 1 nm and 50 nm, e.g. 5 nm.

The material of the growth layer can be deposited after the material of the bottom electrode layer has been deposited and before the material of the piezoelectric layer is deposited.

Figure 3:
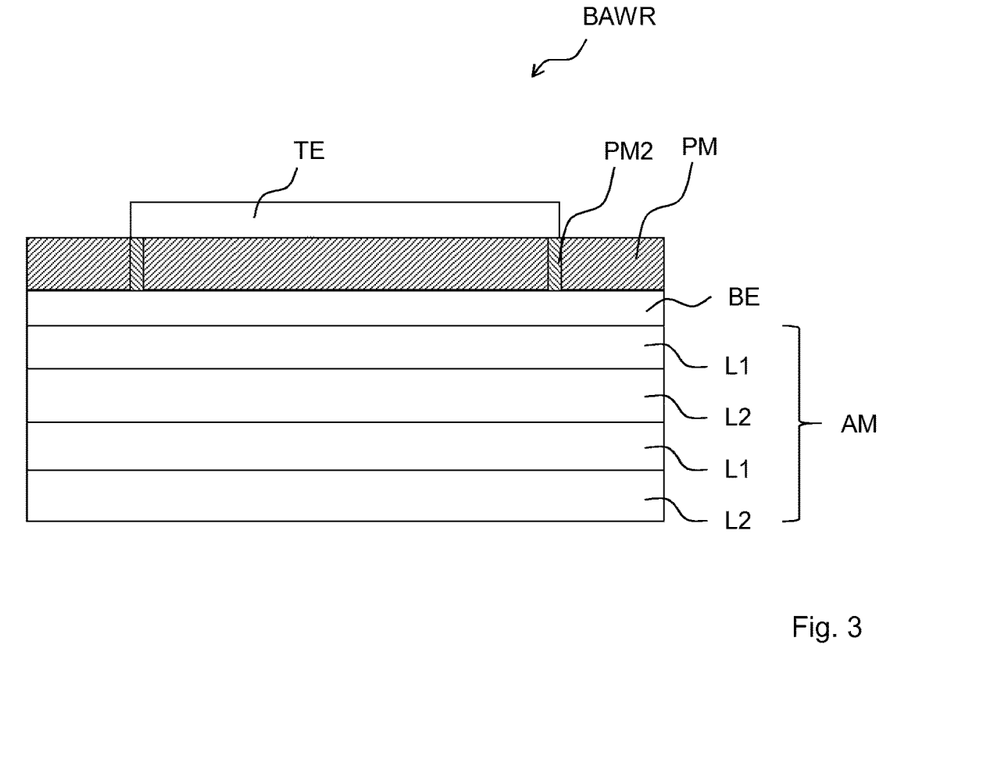
FIG. 3 shows the use of an acoustic mirror.

FIG. 3 shows the possibility of providing an acoustic mirror AM below the bottom electrode BE. The acoustic mirror can have one or several first layers L1 and one or several second layers L2. The first layers L1 and the second layers L2 have different acoustic impedances such that a Bragg-mirror structure for acoustic waves having a vertical wave vector is obtained.

Figure 4:
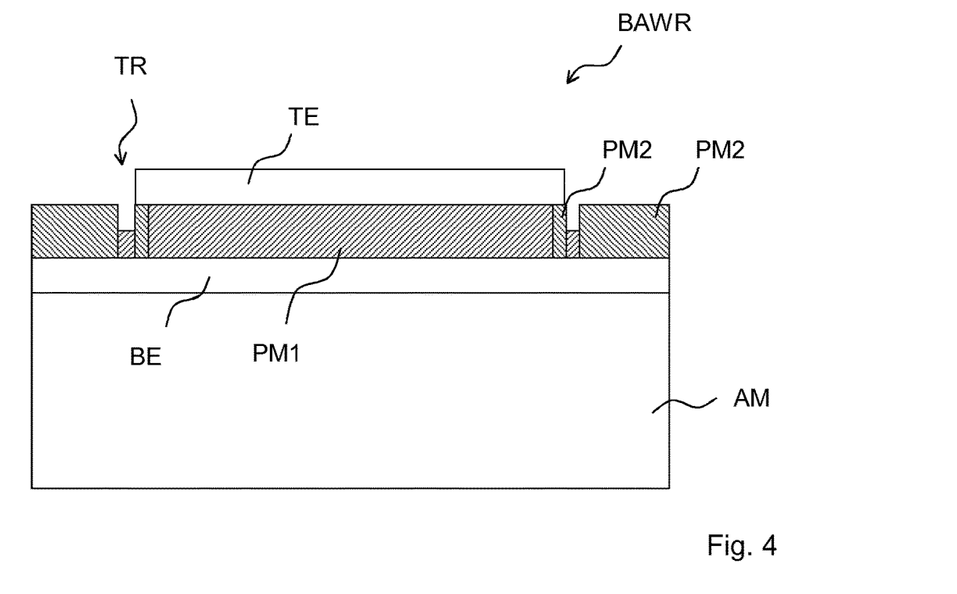
FIG. 4 shows the use of a trench in the piezoelectric layer.

FIG. 4 shows the possibility of providing a trench TR in the piezoelectric layer surrounding the active area of the resonator BAWR. In the trench a remaining part of the first piezoelectric material or of the second piezoelectric material can be arranged. The trench can be characterized in that it is arranged between piezoelectric materials of the same piezoelectric material on both sides. In particular, it is possible that a remaining part of a piezoelectric material differs from the piezoelectric material at the flanks of the trench. Such trenches can easily be manufactured by utilizing a different etching rate for the two different piezoelectric materials. A trench provides a large difference in the acoustic impedance and thus provides a good lateral energy barrier for lateral wave modes.

Figure 5:
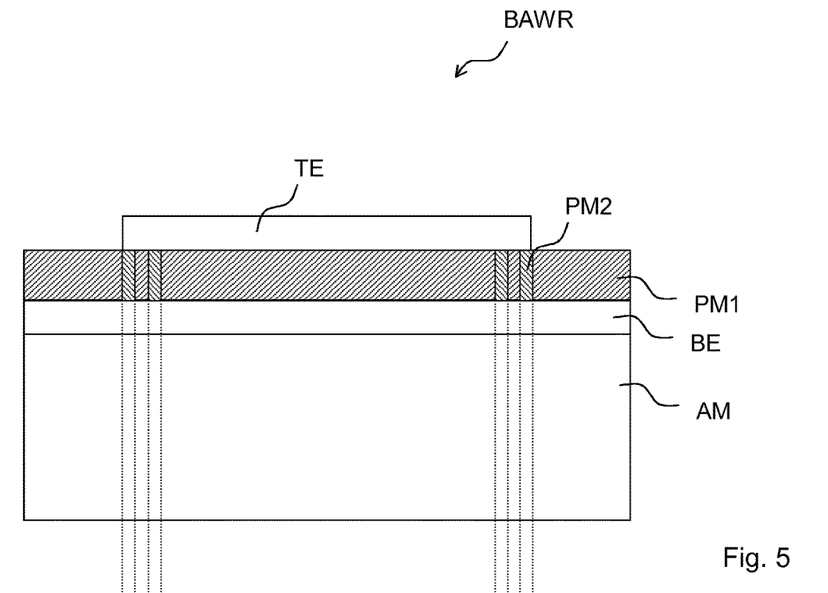
FIG. 5 and correspondingly FIG. 6 show frame-like structures comprising the second piezoelectric material.
Figure 6:
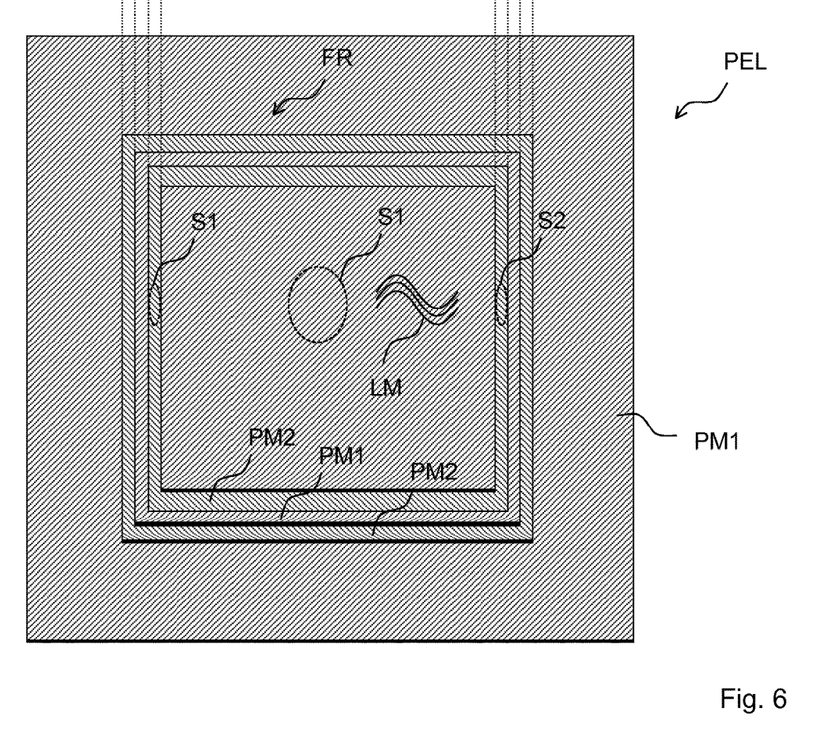

FIG. 5 shows a cross-section through a BAW resonator BAWR and FIG. 6 shows a horizontal cut through the piezoelectric layer. FIGS. 5 and 6 show corresponding relationships between segments and frame structures and the corresponding energy barrier functionality of the different piezoelectric materials.

In the piezoelectric layer two frames consisting of the second piezoelectric material PM2 are embedded in the first piezoelectric material PM1. Thus, one frame consisting of the first piezoelectric material is arranged between the two frames consisting of the second piezoelectric material. A one-dimensional Bragg-mirror structure like an energy barrier is obtained because at least in the vicinity of the rim region of the top electrode TE the first piezoelectric material and the second piezoelectric material have a phase shift in their oscillation. By arranging the first segment S1 of the first piezoelectric material between the first section S1 and the second section S2 of the second piezoelectric material an energy barrier for lateral wave modes LM is obtained and lateral energy leaking is reduced or prevented.

The position of the first and of the first and the second segments of the first and of the second piezoelectric materials are chosen in FIG. 6 to explain the working principle. Of course, other sections of the first and of the second piezoelectric material can work as the first and as the second segments, correspondingly.

The width of the frame and the ratio of the width of adjacent frames determine the effectiveness of the energy barrier with respect to different wave vectors. Thus, with the number of the frame structures, the width of the frame structures and the ratio of width of adjacent frame structures can be chosen according to a desired impact on a certain spectral width.

For example for a resonance frequency of approximately 2.5 GHz a width of a frame structure can be in a range between 1 μm and 10 μm. A preferred width may be 2 μm for a resonance frequency of 2.5 GHz when aluminium nitride is employed as piezoelectric material.

Figure 7:
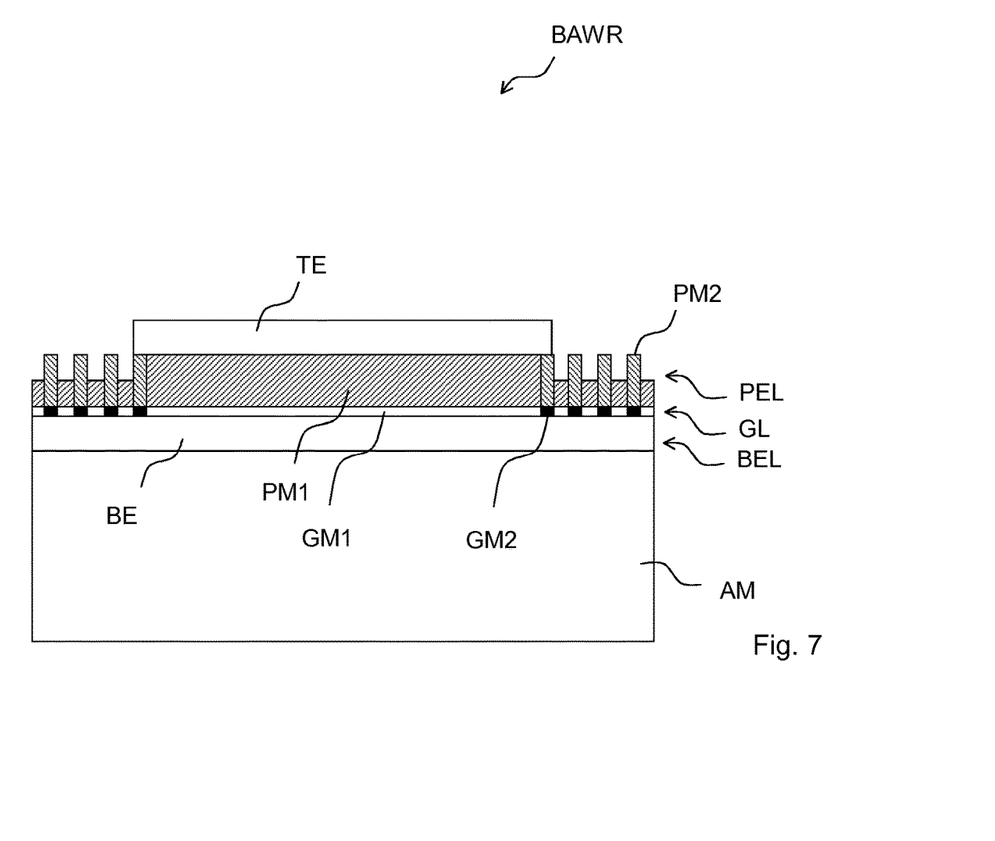
FIG. 7 shows the use of a Bragg-mirror like frame structure surrounding the active resonator area.

FIG. 7 illustrates a Bragg-like mirror structure surrounding the active area of the resonator. The Bragg-like structure comprises a plurality of four or more frames comprising the second piezoelectric material and trenches between the frames having a depth of approximately 50% of the thickness of the piezoelectric layer.

The remaining 50%, i.e. the material below the trench, is filled with the first piezoelectric material.

Figure 8:
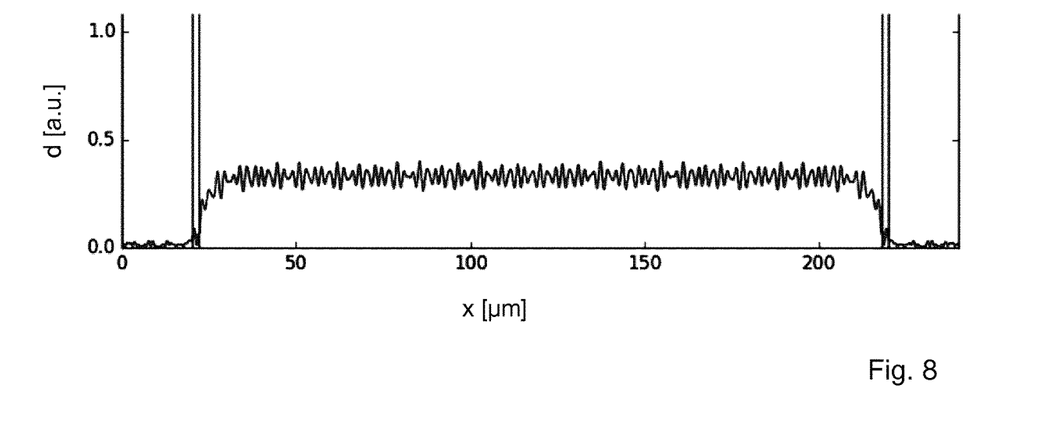
FIG. 8 shows a simulated displacement of a correspondingly improved resonator.

FIG. 8 illustrates a simulation of the displacement in the active area of a resonator having the structure shown in FIG. 3. The active area is surrounded by a frame comprising N-polarized aluminium nitride while the active area comprises Al-polarized aluminium nitride. It can be clearly seen that oscillations outside the active area are practically eliminated. Thus, an effective energy confinement is obtained. Parameter x denotes the lateral position.

Figure 9:
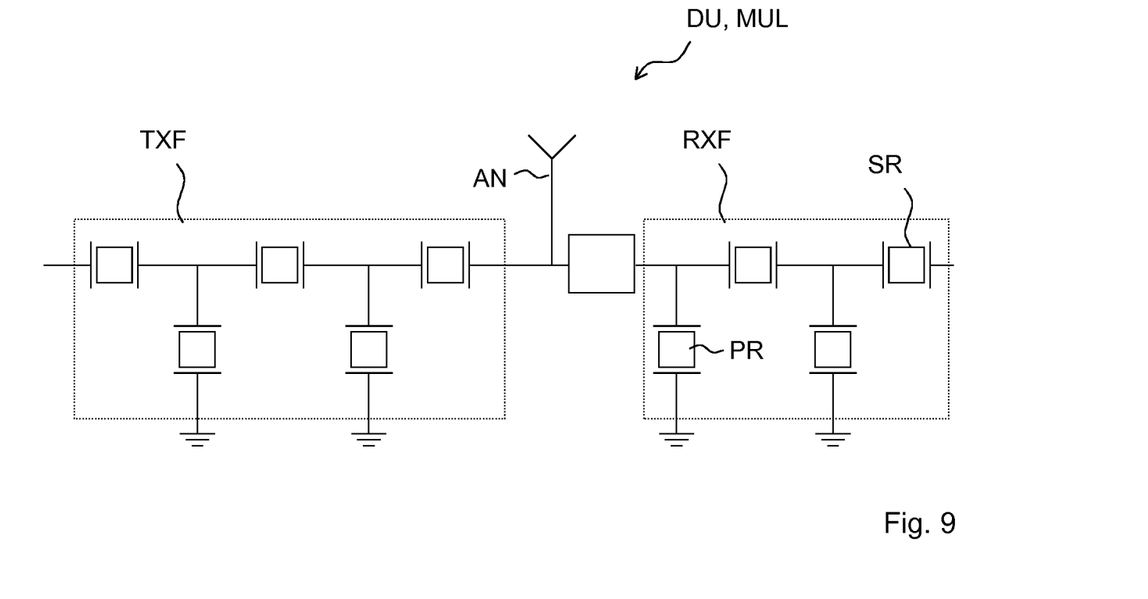
FIG. 9 shows the equivalent circuit diagram of a basic duplexer circuit.

FIG. 9 illustrates how corresponding BAW resonators can be used in filters and multiplexers. Thus, FIG. 9 illustrates a basic circuit topology of a duplexer DU having a transmission filter DXF and a reception filter RXF. The transmission filter TXF and the reception filter RXF have a ladder-type like circuit topology with series resonators SR electrically connected in series in a signal path and with parallel resonators PR electrically connected in parallel paths electrically connecting the signal path to ground. Between the transmission filter TXF and the reception filter RXF an impedance matching circuit, a phase shifting circuit and/or an antenna connection AN can be provided. The antenna connection AN establishes a common port via which transmission signals can be transmitted and via which reception signals can be received. The impedance matching circuit or phase shifting circuit electrically isolates the transmission filter TXF from the reception filter RXF and provides an open impedance and a short circuit impedance for the corresponding frequency ranges.

Figure 10:
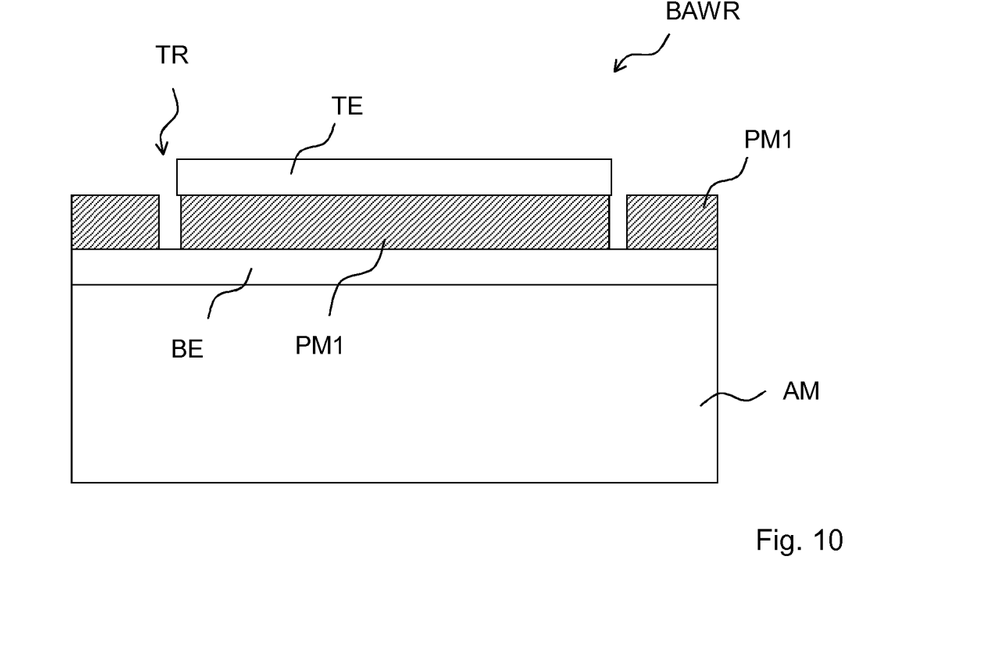
FIG. 10 shows the use of a trench in the piezoelectric layer.

FIG. 10 shows the result of processing steps where the selective removal comprises the full removal of the second piezoelectric material in the vicinity of the active region, e.g. to establish a trench at the perimeter of the active region.

The resonator, the filter, the duplexer and the method are not limited to the features described above and shown in the schematic figures. Resonators can comprise further structures such as conventional frame structures on the top electrode and further mirror structures below the bottom electrode. Filter circuits can comprise further resonators and multiplexers can comprise further filters.

Further, manufacturing methods can comprise further manufacturing steps for providing and processing the necessary elements.

LIST OF REFERENCE SIGNS

AM: acoustic mirror
AN: antenna connection
BAWR: BAW resonator
BE: bottom electrode
BEL: bottom electrode layer
d: displacement
DU: duplexer
GM1: first growth layer material
PM1: first piezoelectric material
L1, L2: first, second layer of acoustic mirror
S1, S2: first, second segment
FR: frame
GL: growth layer
LM: lateral acoustic mode
x: lateral position
MUL: multiplexer
PR: parallel resonator
PEL: piezoelectric layer
RXF: reception filter
GM2: second growth layer material
PM2: second piezoelectric material
SR: series resonator
TE: top electrode
TEL: top electrode layer
TXF: transmission filter
TR: trench

The invention claimed is:

1. A bulk acoustic wave (BAW) resonator comprising
a bottom electrode layer with a bottom electrode;
a top electrode layer with a top electrode above the bottom electrode layer; and
a piezoelectric layer with a first piezoelectric material and a second piezoelectric material, wherein:
the first piezoelectric material and the second piezoelectric material have different piezoelectric polarities,
a first segment of the first piezoelectric material is arranged between a first segment of the second piezoelectric material and a second segment of the second piezoelectric material, the first segment of the second piezoelectric material is arranged between the first segment of the first piezoelectric material and a second segment of the first piezoelectric material or a third segment of the second piezoelectric material, the second segment of the second piezoelectric material is arranged between the first segment of the first piezoelectric material and a third segment of the first piezoelectric material or a fourth segment of the second piezoelectric material, and a top portion of the second segment of the first piezoelectric material or of the third segment of the second piezoelectric material and a top portion of the fourth segment of the second piezoelectric material are below a top portion of the first segment of the first piezoelectric material.

2. The BAW resonator of claim 1, further comprising a growth layer between the bottom electrode layer and the piezoelectric layer.

3. The BAW resonator of claim 2, where an interface between the growth layer and the piezoelectric layer has a first section below the first piezoelectric material and a second section below the second piezoelectric material.

4. The BAW resonator of claim 3, wherein the growth layer in the first section comprises material selected from an Oxide, a Nitride, Ru, $RuO_x$, MOPVE-AlN, and $SiO_2$.

5. The BAW resonator of claim 3, wherein the growth layer in the second section comprises material selected from an Oxide, a Nitride, Ru, $RuO_x$, MOPVE-AlN, and $SiO_2$.

6. A radio frequency (RF) filter comprising the BAW resonator of claim 1.

7. A multiplexer comprising the RF filter of claim 6.

8. The BAW resonator of claim 1, wherein the second piezoelectric material is a lateral energy barrier.

9. The BAW resonator of claim 1, wherein the second piezoelectric material is provided to generate an interference signal.

10. The BAW resonator of claim 1, wherein the first piezoelectric material and the second piezoelectric material have opposite polarities.

11. The BAW resonator of claim 1, wherein the second piezoelectric material terminates an active region of the resonator.

12. The BAW resonator of claim 1, wherein the first piezoelectric material comprises segments of a single frame or segments of two or more frames of which one is nested in another.

13. The BAW resonator of claim 1, wherein at least one of the first piezoelectric material or the second piezoelectric material comprises AlN.

14. The BAW resonator of claim 1, wherein at least one of the first piezoelectric material or the second piezoelectric material comprises a material selected from Sc-doped AlN and $Al_{1-x}Sc_xN$ with $0 \leq x \leq 0.3$.

15. The BAW resonator of claim 1, further comprising a cut out or a trench in the piezoelectric layer.

16. The BAW resonator of claim 1, further comprising a trench in the piezoelectric layer enclosing an active region of the resonator.

17. The BAW resonator of claim 1, wherein at least one of the second segment of the first piezoelectric material or the third segment of the first piezoelectric material is disposed entirely outside of an active region of the resonator.

18. The BAW resonator of claim 1, wherein at least a portion of the first segment of the first piezoelectric material is laterally adjacent to at least a portion of the second segment of the first piezoelectric material, to at least a portion of the third segment of the second piezoelectric material, and to at least a portion of the fourth segment of the second piezoelectric material.

19. The BAW resonator of claim 1, wherein the first segment of the first piezoelectric material is isolated from at least one of the second segment of the first piezoelectric material or the third segment of the first piezoelectric material.

20. A method of manufacturing a bulk acoustic wave (BAW) resonator, comprising:

providing a bottom electrode layer;

structuring a bottom electrode in the bottom electrode layer;

depositing a first piezoelectric material and a second piezoelectric material in a piezoelectric layer on or above the bottom electrode layer, wherein:

the first piezoelectric material and the second piezoelectric material have different piezoelectric polarities, a first segment of the first piezoelectric material is arranged between a first segment of the second piezoelectric material and a second segment of the second piezoelectric material, the first segment of the second piezoelectric material is arranged between the first segment of the first piezoelectric material and a second segment of the first piezoelectric material or a third segment of the second piezoelectric material, the second segment of the second piezoelectric material is arranged between the first segment of the first piezoelectric material and a third segment of the first piezoelectric material or a fourth segment of the second piezoelectric material, and a top portion of the second segment of the first piezoelectric material or of the third segment of the second piezoelectric material and a top portion of the fourth segment of the second piezoelectric material are below a top portion of the first segment of the first piezoelectric material; and depositing a top electrode layer on or above the piezoelectric layer.

21. The method of claim 20, further comprising selectively removing material selected from the first piezoelectric material and the second piezoelectric material.

22. The method of claim 21, wherein the selective removal comprises fully removing a selected segment of the first piezoelectric material or a selected segment of the second piezoelectric material.

23. The method of claim 20, further comprising depositing a growth layer with a first section and a second section.

24. The method of claim 20, further comprising selectively removing material selected from the second piezoelectric material.

25. A bulk acoustic wave (BAW) resonator, comprising:

a bottom electrode layer with a bottom electrode;

a top electrode layer with a top electrode above the bottom electrode layer; and a piezoelectric layer with a first piezoelectric material and a second piezoelectric material, wherein:

the first piezoelectric material and the second piezoelectric material have different piezoelectric polarities, a first segment of the first piezoelectric material is arranged between a first segment of the second piezoelectric material and a second segment of the second piezoelectric material, the first segment of the second piezoelectric material is arranged between the first segment of the first piezoelectric material and a second segment of the first piezoelectric material or a third segment of the second piezoelectric material, the second segment of the second piezoelectric material is arranged between the first segment of the first piezoelectric material and a third segment of the first piezoelectric material or a fourth segment of the second piezoelectric material, and a top portion of the first segment of the second piezoelectric material and a top portion of the second segment of the second piezoelectric material are below a top portion of the first segment of the first piezoelectric material.

26. The BAW resonator of claim 25, wherein at least one of the first segment of the second piezoelectric material or the second segment of the second piezoelectric material is disposed entirely outside of an active region of the resonator.

* * * * *